RADIATION POWERED SEMICONDUCTOR DEVICES

Filed Feb. 1, 1960

INVENTORS
PAUL RAPPAPORT AND
EDWARD PASIERB, JR.
BY W.S. Hill
AGENT

United States Patent Office 3,263,085
Patented July 26, 1966

3,263,085

RADIATION POWERED SEMICONDUCTOR DEVICES

Paul Rappaport, Princeton, and Edward Pasierb, Jr., Trenton, N.J., assignors to Radio Corporation of America, a corporation of Delaware Filed Feb. 1, 1960, Ser. No. 5,904
10 Claims. (Cl. 250—211)

This invention relates to novel radiation powered semiconductor devices which are useful as electronic switches, oscillators and the like.

The devices of this invention include two different recognized types of P–N junctions which are referred to herein as the conventional junction and the tunnel junction. Both types of junctions have a region of semiconductor material of N-type conductivity on one side of the junction and a region of P-type conductivity on the other side of the junction. The two junctions are distinguished in that the N and P type regions on each side of the tunnel P–N junction contain a markedly higher concentration of conductivity type determining impurities than the corresponding regions on each side of the conventional P–N junction.

As a result of the differences in impurity concentrations, the tunnel junction exhibits different electrical characteristics than the conventional junction. The conventional P–N junction exhibits a high electrical resistance when biased with increasing voltage in the backward direction up to the breakdown voltage; whereas under the same conditions the tunnel P–N junction exhibits a very low electrical resistance when biased with increasing voltage in the backward direction. When biased with increasing voltage in the forward direction, the conventional P–N junction exhibits a moderate electrical resistance up to some threshold and then the electrical resistance gradually drops. In the tunnel P–N junction, when biased with increasing voltage in the forward direction, the electrical resistance decreases to a minimum then rises to a maximum and then again decreases. The decrease in resistance is referred to as a negative resistance characteristic since the current is decreasing with increasing voltage and generally occurs in a range of low voltages in the forward direction less than 0.5 volt. This negative resistance characteristic is optimized in the tunnel P–N junction by making the transition from the N-type region to the P-type region as abrupt as possible. The structure and operation of the tunnel P–N junction is explained by H. S. Sommers, Jr., in "Tunnel Diodes as High-Frequency Devices," Proceedings of IRE, vol. 47, 1201–1206, July 1959. Such tunnel P–N junctions are useful in amplifiers, oscillators, and bistable devices such as switches because of the negative resistance characteristic.

The conventional P–N junction has been used previously as a diode or as a collector of radiation-generated free charge carriers in semiconductor devices which convert radiant energy into electrical energy. This latter use is referred to as the photovoltaic effect, which is very marked with conventional P–N junctions; whereas it is an insignificant effect with tunnel P–N junctions.

The conventional junction may be adapted to convert light, particularly sunlight, into electrical energy, by locating the junction within a diffusion length of the light receiving surface of the semiconductor body. The effect is optimized by making the junction of relatively large area, by matching the spectral response of the semiconductor to the spectral distribution of the incident light, and by providing a thin low resistance contact to the light-receiving surface of the semiconductor body. When so adapted and optimized, the conventional P–N junction is referred to as a radiation converter or as a solar cell.

An object of this invention is to provide novel self-powered semiconductor devices.

A further object is to provide novel semiconducting devices including both a conventional P–N junction as a radiation converter and a tunnel P–N junction in a single semiconductor body.

In general, the devices herein comprise a single crystal semiconductor body having therein both a conventional P–N junction adapted to convert radiant energy into electrical energy, and a tunnel P–N junction characterized by exhibiting a negative resistance characteristic when biased in a range of low voltage in the forward direction.

Light incident upon the semiconductor body generates a photovoltaic voltage across the conventional P–N junction. This voltage is applied across the tunnel P–N junction and may be sufficiently high to place the tunnel P–N junction in the positive resistance mode at the high voltage end of the negative resistance mode. Depending upon the load upon the tunnel P–N junction, it may be made to switch either (1) between two stable states of conduction on either side of the negative resistance region or (2) between two states, one quiescent and the other oscillating about a point in the negative resistance region. Switching in either case may be achieved either (1) by changing the light incident on the conventional P–N junction or (2) by interposing an electrical signal or a resistance between the two P–N junctions. In each of these cases, the effect is to change the voltage applied to the tunnel P–N junction.

The devices herein include also a single crystal semiconductor body having therein a conventional P–N junction adapted to convert radiant energy to electrical energy, and a plurality of tunnel P–N junctions. The photovoltaic voltage generated across the conventional P–N junction is applied across each of the tunnel P–N junctions and the impedances in series therewith. By using a different impedance with each tunnel P–N junction, the device may be used to measure quantized amounts of light or electrical signal.

The invention is described in more detail in the following specification in conjunction with the drawing in which FIGURE 1 is a partially schematic, elevational view of a first embodiment of the invention;

Figures 1, 2, 3, 4:
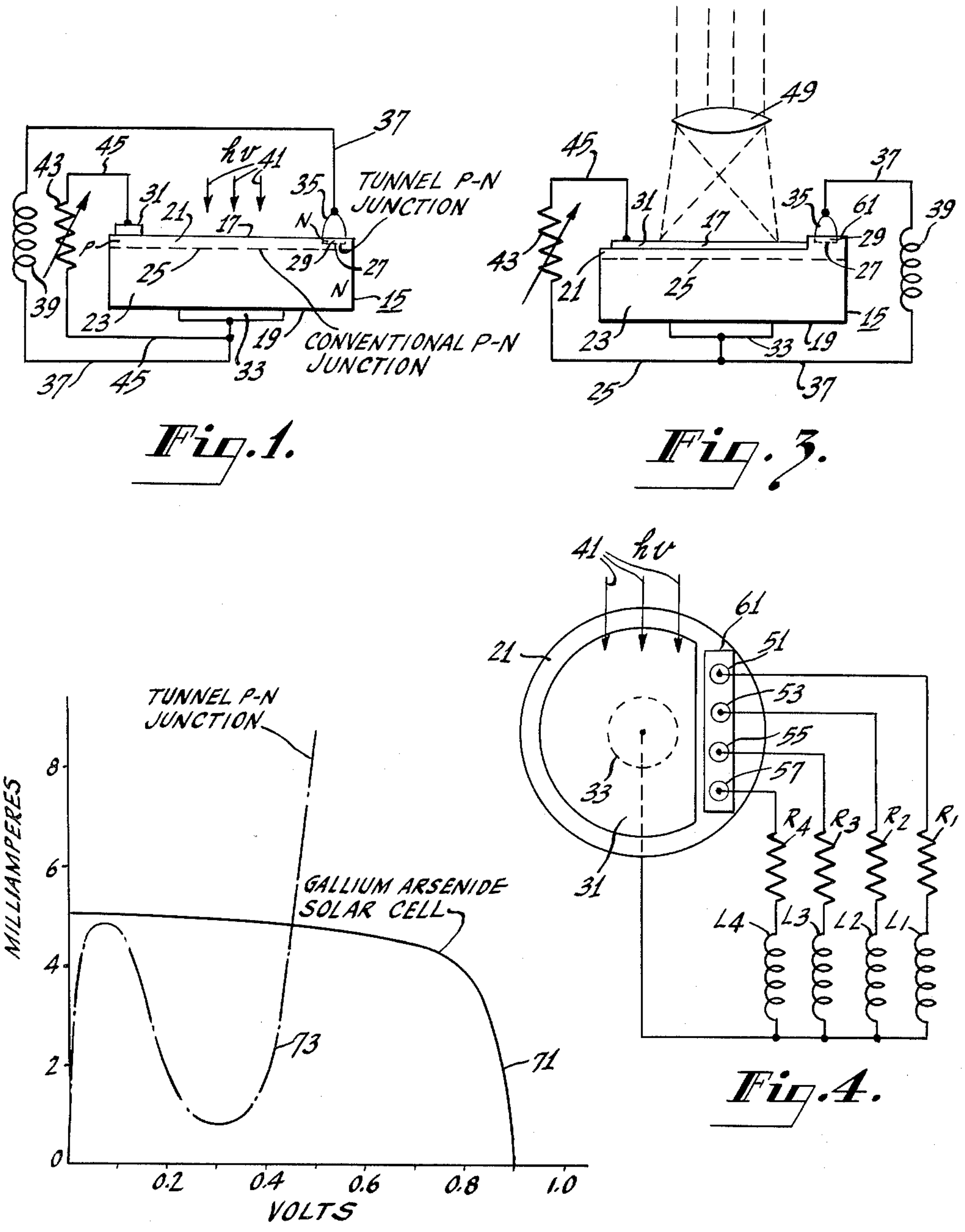
FIGURE 2 is a graph showing the maximum output current and voltage of a conventional P–N junction as a solar radiation converter (solid line) and the voltage-current characteristic of the tunnel P–N junction (dotted line) of the embodiment of FIGURE 1.
FIGURE 3 is a partially schematic, elevational view of a second embodiment of the invention.
FIGURE 4 is a partially schematic plan view of a third embodiment of the invention.

Similar reference characteristics are used for similar structural elements throughout the drawing.

FIGURE 1 illustrates a typical embodiment of the invention comprising a single crystal 15 of gallium arsenide having two opposed upper and lower surfaces 17 and 19. The crystal 15 is comprised of a P type region 21 including most of the upper opposed surface 17; an N type region 23 including the lower opposed surface 19; and a conventional P–N junction 25 between the P type region 21 and N type region 23. The conventional P–N junction 25 is spaced from the upper opposed surface 17 a distance less than a diffusion length for minority charge carriers generated within the P-type region 21.

At one side of the upper opposed surface 17 and covering only a small fraction of the area thereof is a tunnel P-N junction 27, including the afore-mentioned P-type region 21 and a second N-type region 29. As pointed out below, the P-type and N-type regions 21 and 29 adjacent both sides of the tunnel P-N junction 27 have a higher concentration of conductivity-type determining impurities than corresponding regions adjacent the conventional P-N junction 25.

One feature of the device of the invention is that the conventional and tunnel P-N junctions therein have a common semi-conductor region. In the device of FIGURE 1, the P-type region 21 of the conventional P-N junction should be highly doped for optimum results as a radiation converter. Consistent with this is a high doping of this region 21 as a part of the tunnel P-N junction. Non-rectifying connections are made to the P-type region 21 by an electrode 31; to the first N-type region 23 by an electrode 33, and to the second N-type region 29 by an electrode 35.

When light photons 41 of energy $h\nu$ are incident upon the upper opposed surface 17, free charge carriers are generated in the P-type region 21. The free minority charge carriers, being within a diffusion length of the conventional junction 25 are collected by that junction 25 producing thereby a photovoltaic voltage and current polarized to yield a positive voltage on the P side and a negative voltage on the N side. For solar illumination on a gallium arsenide crystal, the maximum photovoltaic voltage varies according to the load up to about 0.9 volt, as shown in FIGURE 2. The maximum voltage for other semiconductors are about: silicon 0.55 volt, germanium 0.30 and indium arsenide 0.10 volt. The maximum photovoltage is limited by the energy band gap of the semiconductor. The photocurrent is theoretically unlimited because it may be increased merely by increasing the area of the junction.

The generated photovoltaic voltage is applied across the tunnel P-N junction 27 to bias the tunnel P-N junction in the forward direction to perform a useful function. The P-type region 21 is common to both P-N junctions and serves as an internal circuit connection. An external circuit lead 37 connects the electrode 33 to the electrode 35 through a load inductance 39. A tunnel P-N junction in gallium arsenide, having a load for operation in a bistable mode between two stable states, will switch to its high voltage state at about 0.3 volt. The voltage applied to the tunnel P-N junction may be reduced by a variable impedance 43 connected by leads 45 between electrode 31 and electrode 33 to switch the tunnel P-N junction to its low voltage mode at about 0.15 volt. In place of the variable impedance 43, one may insert a signal source (not shown). The variable impedance 43 may also be used to set the maximum generated photovoltaic voltage of the conventional P-N junction 25. Finally, the magnitude of the photovoltaic voltage is determined by the intensity of the incident radiant energy. Thus, by changing the incident light intensity, the tunnel P-N junction can be made to switch between the two bistable modes.

In FIGURE 2, the solid curve 71 illustrates the maximum photovoltaic voltage and current generated in the conventional P-N junction 25 of the device of FIGURE 1 irradiated with sunlight and not connected to the tunnel P-N junction. The broken curve 73 illustrates the voltage-current characteristic of the tunnel P-N junction of the same device with an applied voltage but not connected to the conventional P-N junction of the device. Note that both the photovoltaic voltage and current generating capacity of the conventional P-N junction in gallium arsenide are adequate to operate the tunnel P-N junction in a switch or an oscillator circuit.

By selecting an inductance 39 giving a load line steeper than the negative resistance portion of the curve 73 of FIGURE 2, the device of FIGURE 1 can operate as a self-powered oscillator or amplifier. The frequency of oscillation is determined by the inductance 39 and the capacitance of the tunnel junction 27. The frequency of oscillation may be fixed by setting the inductance and capacitance of the tunnel P-N junction circuit at fixed values, or may be varied as by substituting a variable inductor for the fixed inductor 39. In the case of a radiation-powered oscillator, the variable impedance 43 includes a resistance sufficient to keep the photovoltaic voltage of the conventional P-N junction 25 out of the almost constant current portion of the curve 71. About 150 ohms are required to perform this function. A relaxation oscillator may be made using the same circuit but with a somewhat lower resistance. By selecting a load giving a load line less steep than the negative resistance portion of the curve 73 instead of the inductance 39, the device of FIGURE 1 can operate as a self-powered switch or counter.

Referring again to FIGURE 1, in the case where the device is used as a self-powered oscillator, the inductor 39 and the junction capacitance of the tunnel diode are the frequency determining factors of the circuit. Within a limited portion of the negative resistance curve, the change in junction capacitance with applied voltage is linear. Consequently, within this limited portion of the curve, for any given value of applied voltage, there is a fixed value of junction capacitance and hence but one frequency of oscillation, provided the inductance 39 is fixed. If the junction capacitance is made to vary by varying the voltage applied to the junction, the frequency of oscillation will also vary. Since the voltage applied to the tunnel diode junction is derived from the solar energy converter, and since by proper choice of shunt resistance 43, the output voltage of the solar energy converter can be made to be a substantially linear function of light intensity. Then the junction capacitance of the tunnel diode, and hence the frequency of oscillation, can be made to vary linearly with light intensity. By varying the intensity of the light appearing on the surface of the solar energy converter at an audio note, (or at any other frequency), the resultant output frequency of the tunnel diode oscillator circuit will be a frequency modulated signal varying about a center frequency determined by the average light intensity. If the source of light is a focused microscope lamp operated from a 60 cycle line, the light intensity of which therefore varies at 120 c.p.s., a 120 cycle per second tone can be heard from an FM receiver tuned to receive the radiation from the inductance 39 of the center frequency of the tuned diode oscillator.

The embodiment of FIGURE 1 may be made by the following process. A single crystal of gallium arsenide having N-type conductivity by the presence of sulfur or selenium impurities to give a free charge carrier concentration of about $10^{17}$ carriers/cc. and being about 0.25 x 0.25 x 0.01 inch thick is heated at about 1100° C. for one hour in an atmosphere containing zinc vapor. During heating, zinc atoms diffuse into the surfaces of the wafer to produce a P-type skin and a conventional P–N junction between the skin and the body. The concentration of zinc impurities is greatest at the surface of the wafer, the skin being degenerate or close to degenerate at the surface. The zinc impurity concentration decreases with distance from the surface. After cooling, the skin is removed from all but one surface of the wafer as by etching or lapping. A small dot of tin (98 by weight percent)-tellurium (2 by weight percent) alloy is placed on one side of the unetched surface and reheated at 425° C. for several seconds and then cooled. The reheating at a lower temperature for a short time does not disturb the impurities in the P-type skin. However, on reheating, the alloy dot melts, dissolves a thin layer of the P-type skin just beneath it and, during cooling, recrystallized producing a P-type region, a second N-type region of very high impurity content and a tunnel P–N junction therebetween. The excess alloy serves as an ohmic connection to the second N-type region. Ohmic or non-rectifying connections are then made to the etched and unetched portions of the wafer for example with evaporated indium metal.

The embodiment of FIGURE 1 is described with respect to gallium arsenide as the semiconductor. Any semiconductor material, however, may be used. Some examples of semiconductor materials are germanium, silicon, indium arsenide, indium antimonide, and indium phosphide. In selecting the semiconductor, the bandgap of the semiconductor is the major consideration in matching the spectral response of the conventional P–N junction to the incident radiant energy. The temperature at which the device is to operate also frequently determines the bandgap of the semiconductor chosen. The bandgap and the dielectric constant of the semiconductor are important factors in determining the free charge carrier concentration necessary to produce a tunnel P–N junction.

Similarly, the invention is not limited to the above recited impurities or methods of fabrication. Any of the usual N-type and P-type impurities may be used in the selected semi-conductor body. Similarly, any method of incorporation may be used. Further, a complementary structure may also be produced; i.e., where N-type regions appear in the device of FIGURE 1, P-type regions may be substituted provided N-type regions are substituted also for P-type regions.

FIGURE 3 is an embodiment similar to that of FIGURE 1 except that (1) the tunnel P–N junction 27 is on a small mesa or pedestal 61, (2) the non-rectifying electrode 31 to the common P-type region 21 is transparent to the incident radiant energy and extends over most of the light-receiving surface, and (3) a means comprising a lens 49 for directing radiant energy incident upon the light receiving surface 17 as shown.

By placing the tunnel P–N junction 27 on a small pedestal 61, the P-type region may be conveniently tailored to have a high conductivity, almost degenerate, region adjacent the tunnel P–N junction and to have a somewhat lower conductivity region adjacent the conventional P–N junction having a thickness optimized to the use of the device.

By extending the electrode 31 to cover most of the light-receiving surface, the series resistance of the solar cell is materially decreased which results in greater efficiency of operation. The electrode 31 should be highly transparent to radiant energy which produces the free charge carriers.

Means for directing radiant energy incident upon the light-receiving surface may be important to prevent losses of light energy which is used to power or to switch the device.

The device of FIGURE 3 may be prepared in the manner of the device of FIGURE 1. A single crystal wafer of gallium arsenide about 0.250 x 0.250 x 0.020 inch thick and having a free charge carrier concentration of about $10^{17}$ carriers/cc. is placed, in an evacuated quartz ampoule with a small amount of zinc, cadmium, or manganese metal, and heated at 800–1100° C. for 2 to 5 hours. If zinc is the diffusant, a temperature of 950° C. for 5 hours produces a P-type region 21 having a surface carrier concentration of about $10^{19}$ carriers/cc. which decreases to about $10^{17}$ carriers/cc. about 0.004 inch below the surface. The ampoule is cooled and broken.

All of the surfaces of the wafer but one major surface, (the upper in FIGURE 3) may be etched or lapped to remove the diffused region and to expose the N-type region 23 below. The one major surface is then etched or lapped except for a small area providing a mesa 61. The etching or lapping to the one major surface is carried only far enough to reduce the thickness of the diffused region to a desired value to give the optimum radiant energy conversion efficiency. This is slightly less than a diffusion length for minority charge carriers or about .0001 inch thick.

A tin metal or tin-tellurium alloy dot is then alloyed to the mesa, as in the device of FIGURE 1, to produce a tunnel P–N junction. Ohmic contact to the N-type region 23 is made by evaporating a layer of indium to the surface 19. The transparent ohmic contact 31 to the surface 17 of the P-type region 21 is made by evaporating a thin layer of indium thereon. Connections may then be made by soldering.

The devices of the invention are described as "radiation-powered" to mean that they have integrated therein means for converting radiant energy into usable electrical energy. As described above, the source of radiant energy is not included. Optionally, however, a source of radiant energy may be included. One convenient source of radiant energy is a thin layer of radioactive material coated upon the surface 17 of P-type region 21 of the device of FIGURE 1, or upon the transparent ohmic contact 31 of the device of FIGURE 3.

FIGURE 4 illustrates an embodiment of the invention which may be used as a radiation-powered, quantized light level indicator. The device is similar in structure to the device of FIGURE 3 except that a plurality of tunnel P–N junction 51, 53, 55, 57 are made to the semiconductor wafer. Each junction, 51, 53, 55, and 57 is connected through its own series resistance $R_1$, $R_2$, $R_3$ and $R_4$ and inductance $L_1$, $L_2$, $L_3$ and $L_4$ respectively to the non-rectifying contact 33. Thus, each tunnel P–N junction has a separate circuit associated therewith across which the photovoltaic voltage is applied.

The values of the resistances $R_1$, $R_2$, $R_3$, and $R_4$ and of the inductances $L_1$, $L_2$, $L_3$, and $L_4$ designated for junctions 51, 53, 55 and 57 respectively are adjusted either to switch (or to oscillate) the circuit at a different value of photovoltage. Since the photovoltage is a function of intensity of the incident light, the device measures and quantizes the particular signal. For example a light pulse 41 of unknown intensity is incident on the light-receiving surface. The intensity is such that a photovoltage is generated so that circuits associated with junctions 51, 53 and 55 switch (or oscillate). Having previously calibrated the device, we know the intensity falls between two known values.

In order to read which circuit has switched, it is only necessary to read the voltage across the series resistance $R_1$, $R_2$, $R_3$, and $R_4$ in each circuit or the voltage across the resistors may be used to operate a counter or indicator circuit. In order to read which circuit oscillates, it is only necessary to couple (closely or loosely) a separate read out inductance (not shown) to each inductance $L_1$, $L_2$, $L_3$ and $L_4$ in each circuit. In the case of oscillation, the oscillation frequency is adjustable, so that a different frequency may be selected for each circuit. A read out inductance in the form of a variable tuned receiver need be coupled to all of the circuit inductances $L_1$, $L_2$, $L_3$ and $L_4$.

What is claimed:

1. A semiconductor device comprising a single crystal semiconductor body, a conventional P-N junction in said body at least a portion of which is substantially parallel to and within a diffusion length for minority charge carriers of a surface of said body, a non-rectifying electrode contacting said surface, and a tunnel P-N junction in said body between and spaced from both said conventional P-N junction and said surface, said tunnel P-N junction being characterized by exhibiting a negative resistance characteristic when biased in a range of low voltage in the forward direction.

2. A semiconductor device comprising a single crystal semiconductor body, a conventional P-N junction in said body at least a portion of which is substantially parallel to and within a diffusion length for minority charge carriers of a surface of said body, a non-rectifying electrode contacting said surface, and a plurality of tunnel P-N junctions in said body, each of said tunnel P-N junctions being between and spaced from both said conventional P-N junctions and said surface, each tunnel P-N junction being characterized by exhibiting a negative resistance characteristic when biased in a range of low voltage in the forward direction.

3. A semiconductor device comprising a single crystal semiconductor body of gallium arsenide, a first conventional P-N junction in said body at least a portion of which is substantially parallel to and within a diffusion length for minority charge carriers of a surface of said body, means for directing radiant energy incident upon said surface, non-rectifying electrode means at least partially transparent to said radiant energy contacting said surface, and a second tunnel P-N junction in said body between and spaced from both said conventional P-N junction and said surface, said tunnel P-N junction being characterized by exhibiting a negative resistance characteristic when biased in a range of low voltage in the forward direction.

4. A semiconductor device comprising a single crystal semiconductor body of gallium arsenide having a first region of one conductivity type, a second region of opposite conductivity type and a conventional P-N junction therebetween, said conventional P-N junction being substantially parallel to and within a diffusion length for minority carriers of at least a portion of a surface of said body, a first non-rectifying electrode at least partially transparent to light contacting said surface at said first region, a second non-rectifying electrode contacting said second region, and a tunnel P-N junction between and spaced from both said conventional P-N junction and said surface and characterized by exhibiting a negative resistance characteristic when biased in a range of low voltage in the forward direction.

5. The device of claim 4 including means for directing radiant energy upon said surface.

6. A semiconductor device comprising a single crystal semiconductor body having a pair of opposed surfaces, and including a region of N-type conductivity, a region of P-type conductivity in said body and adjacent one of said opposed surfaces, a first P-N junction of the conventional type for generating a photovoltaic voltage when light is incident on said one surface between said regions and substantially parallel to at least a portion of said one surface and within a diffusion length for minority carriers of said one surface, a first non-rectifying electrode at least partially transparent to light contacting said P-region on said one surface, a second non-rectifying electrode contacting the other of said opposed surfaces, and a second P-N junction of the tunnel type between and spaced from both said conventional P-N junction and said surface and characterized by exhibiting a negative resistance characteristic when biased in a range of low voltage in the forward direction.

7. A semiconductor device comprising a single crystal semiconductor body of gallium arsenide having a pair of opposed surfaces, and including a region of N-type conductivity, a region of P-type conductivity in said body and adjacent one of said opposed surfaces, a first P-N junction of the conventional type for generating a photovoltaic voltage when light is incident on said one surface between said regions and substantially parallel to at least a portion of said one surface and within a diffusion length for minority carriers of said one surface, a first non-rectifying electrode at least partially transparent to light contacting said one surface, a second non-rectifying electrode contacting the other of said opposed surfaces, and a second P-N junction of the tunnel type between and spaced from both said conventional P-N junction and said surface and characterized by exhibiting a negative resistance characteristic when biased in a range of low voltage in the forward direction, and means for directing light incident upon said surface whereby to generate a photovoltaic voltage across said first P-N junction.

8. A semiconductor device comprising a single crystal semiconductor body having therein a first P-N junction of the conventional type and particularly adapted to generate a photovoltaic voltage thereacross when light is incident on a surface of said body and a plurality of second P-N junctions of the tunnel type each arranged in series with said first P-N junction, and parallel to each other, each of said tunnel P-N junctions being between said conventional P-N junction and said surface, separate circuit means for applying said photovoltaic voltage across each of said second P-N junctions, each circuit means being adapted to apply a different voltage value below said generated photovoltaic voltage to each of said second junctions, each circuit means including a differently-valued impedance and one of said second P-N junctions connected in series.

9. A semiconductor device comprising a single crystal semiconductor body of predominantly N-type conductivity and having a pair of opposed surfaces, a region of P-type conductivity in said body and adjacent one of said opposed surfaces, a first P-N junction of the conventional type for generating a photovoltaic voltage when light is incident on said one surface substantially parallel to at least a portion of said one surface and within a diffusion length for minority carriers of said one surface, a first non-rectifying electrode at least partially transparent to light contacting said P-region, a second non-rectifying electrode contacting said opposed surface, and a second P-N junction of the tunnel type between and spaced from both said conventional P-N junction and said surface and characterized by exhibiting a negative resistance characteristic when biased in a range of low voltage in the forward direction, means for directing light incident upon said surface, and a circuit for applying said photovoltaic voltage across said second P-N junction, said circuit including a resistance connected in series with said second P-N junction.

10. A semiconductor device comprising a single crystal semiconductor body, a conventional P-N junction in said body substantially parallel to and within a diffusion length for minority charge carriers of a surface of said body, a non-rectifying electrode contacting a substantial portion of said surface, said electrode being at least partially transparent to radiant energy in the range of spectral sensitivity of said semiconductor body, and a tunnel P-N junction in said body between and spaced from both said conventional P-N junction and said surface, said tunnel P-N junction being characterized by exhibiting a negative resistance characteristic when biased in a range of low voltage in the forward direction.

References Cited by the Examiner

UNITED STATES PATENTS

| | | | |
|---|---|---|---|
| 2,777,065 | 1/1957 | Pritchard | 333—80 |
| 2,846,592 | 8/1958 | Rutz | 250—211 |
| 2,863,056 | 12/1958 | Pankove | 250—211 X |
| 2,944,165 | 7/1960 | Stuetzer | 250—211 |
| 2,962,605 | 11/1960 | Grosvalet | 317—235 |
| 2,981,849 | 4/1961 | Gobat | 317—235 |
| 3,046,405 | 7/1962 | Emeis | 250—211 |
| 3,050,684 | 8/1962 | Sclar | 325—105 |
| 3,079,512 | 2/1963 | Rutz | 317—235 X |

OTHER REFERENCES

Coblenz: Electronics, Nov. 1, 1957 (pp. 144–149).

Lesk et al.: Electronics, Nov. 27, 1959 (pp. 60–64).

Sommers: Proceedings of the I.R.E., July 1959 (pp. 1201–1206).

Wallmark: RCA Engineer, vol. 5, No. 1, June–July 1959 (pp. 42–45).

RALPH G. NILSON, *Primary Examiner.*

RICHARD M. WOOD, *Examiner.*

W. STOLWEIN, *Assistant Examiner.*